United States Patent [19]

Sogo

[11] 4,158,613
[45] Jun. 19, 1979

[54] METHOD OF FORMING A METAL INTERCONNECT STRUCTURE FOR INTEGRATED CIRCUITS

[75] Inventor: Marilyn R. Sogo, San Diego, Calif.

[73] Assignee: Burroughs Corporation, Detroit, Mich.

[21] Appl. No.: 966,326

[22] Filed: Dec. 4, 1978

[51] Int. Cl.² .................... C25D 5/02; H01L 23/48
[52] U.S. Cl. .................................... 204/15; 357/71
[58] Field of Search ............... 204/15, 42; 357/71; 29/577 R

[56] References Cited

U.S. PATENT DOCUMENTS

| 3,285,836 | 11/1966 | Maissel et al. | 204/15 |
| 3,294,653 | 12/1966 | Keller et al. | 204/15 |
| 3,741,880 | 6/1973 | Shiba et al. | 204/15 |
| 3,864,217 | 2/1975 | Takahata et al. | 204/15 |
| 3,939,047 | 2/1976 | Tsunemitsu et al. | 204/15 |
| 4,045,302 | 8/1977 | Gibbs et al. | 204/15 |

Primary Examiner—T. M. Tufariello
Attorney, Agent, or Firm—Mervyn L. Young; Kevin R. Peterson

[57] ABSTRACT

A method for forming an aluminum interconnect structure on an integrated circuit chip which method employs the anodization of the aluminum but eliminates the necessity for the formation of a hard anodic barrier on the aluminum. Furthermore, the technique provides a superior "cold via" contact. A layer of tantalum is placed over an aluminum layer which tantalum is patterned to define the desired aluminum interconnect structure. Both the exposed aluminum and the tantalum are anodized to form both the interconnect structure and a thin layer of anodic tantalum which is then removed.

10 Claims, 5 Drawing Figures

METHOD OF FORMING A METAL INTERCONNECT STRUCTURE FOR INTEGRATED CIRCUITS

BACKGROUND OF THE INVENTION

1. Field of Invention

This invention relates to a method of forming a metal interconnect structure for integrated circuits and more particularly to such a method wherein the interconnect structure is formed by anodizing aluminum.

2. Description of the Prior Art

In the formation of integrated circuit chips, the electrical interconnections between the various elements on the wafer can be formed by depositing aluminum over the respective chips and then anodizing the aluminum in a particular pattern so as to form the respective conductor circuits between the elements. In the anodization process, a barrier layer of aluminum oxide is formed over the aluminum and a photoresist pattern is then formed over the barrier layer utilizing standard photolithographic techniques. The barrier layer prevents the formation of hillocks in the aluminum during later processing. The barrier layer is then etched away in those areas where there is no photoresist pattern, and those portions of the aluminum layer thus exposed are then subsequently anodized to form the insulating areas that define the conductive circuit patterns. Such prior art techniques are disclosed, for example, in the Gibbs et al U.S. Pat. No. 4,045,302.

Memory cells for electrically alterable read-only memories may be formed on top of the integrated circuit structure, which cells are formed of amorphous semiconductor materials which are capable of being switched to and from a low resistance crystalline state. The particular type of memory switching amorphous semiconductor material is the tellurium based chalcogenide class of materials. Such an amorphous memory device is described, for example, in the Bluhm U.S. Pat. No. 4,115,872.

A particular problem in making electrical contact with such an amorphous material is that it will interdiffuse with the aluminum conductive material during the fabrication, or during the electrical write operation after the device has been fabricated. Thus, in the prior art fabrication of such devices, a refractory material must first be placed over the conductor at those positions where contact is to be made. This requires additional lithographic and other processing steps which increase the time and cost of fabrication.

It is then, an object of the present invention to provide an improved method of making a conductor structure.

It is another object of the present invention to provide an improved method of making an electrical conductor structure for employment with integrated circuit chips.

It is still a further object of the present invention to provide an improved method of making a conductor structure that can make electrical contact with amorphous semiconductor materials.

SUMMARY OF THE INVENTION

The above identified and other objects are achieved by the present invention by placing a layer of tantalum over an aluminum layer which tantalum is patterned to define the desired aluminum interconnect structure. Both the exposed aluminum and the tantalum are then anodized to form both the interconnect structure and a thin layer of anodic tantalum which is subsequently removed. This method eliminates the necessity for the formation of a hard anodic barrier on the aluminum. Furthermore, the technique provides a superior "cold via" contact.

A feature of the present invention then resides in placing a layer of tantalum over an aluminum layer which tantalum is patterned to define the desired aluminum interconnect structure, anodizing both the exposed aluminum and the tantalum to form the interconnect structure and a thin layer of anodic tantalum which is then removed.

DESCRIPTION OF THE DRAWINGS

The above and other objects, advantages and features of the present invention will become more readily apparent from a review of the following specification when taken in conjunction with the drawings wherein.

GENERAL DESCRIPTION OF THE INVENTION

Figure 1:
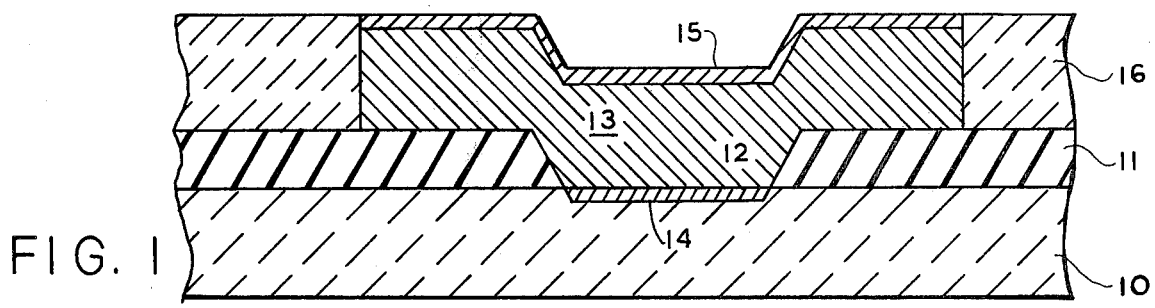
FIGS. 1 and 2 are cross-sectional views of electrical contacts as employed in the prior art.

In order to illustrate the differences between the present invention and the prior art, a typical prior art embodiment will now be described in relation to FIG. 1. As shown therein, an insulative layer 11 which may be silicon dioxide is formed on the surface of semiconductor substrate 10 and via 12 is opended in layer 11 for subsequent electrical contact with substrate 10. Substrate 10 may have various active devices formed therein. Aluminum interconnect layer 13 is then deposited over insulative layer 11 and via 12 where it forms an aluminum-silicon alloyed Schottky diode 14 with the silicon substrate 10. This could also be an ohmic contact to other silicon regions on the wafer depending on the dopant concentration in the silicon under via 12. The entire conductive layer 13 is then subjected to a hard anodization to form a dense aluminum oxide layer 15 of approximately 1000 angstroms in thickness. Prior to this hard anodization, aluminum layer 13 may be subjected to a soft anodization to form a thin porous oxide layer (not shown) for resist adhesion. Hard barrier layer 15 is provided in order to prevent the formation of hillocks that can cause short circuits with other connectors placed over aluminum connect 13. A photoresist pattern is then formed over areas of the wafer wherever a metal pattern is desired. Hard barrier layer 15 is then etched away in the areas where there is no photoresist pattern. The exposed portions of aluminum layer 13 are then provided with a soft anodization to create porous aluminum oxide regions 16 where the aluminum interconnect is not desired. After the photoresist layer is removed, the structure thus formed is then ready for the deposition of a second dielectric layer and so forth. In addition to the suppression of hillocks during subsequent high temperature processing, or high current densities, hard anodic oxide layer 15, further serves to prevent anodization of the aluminum conductors thereunder.

As was indicated above, a problem is encountered when the device is being fabricated to employ amorphous semiconductor materials such as might be employed in erasable read-only memories. Cells formed of such materials require electrical contacts with both the bottom and upper surfaces. Therefore, in the fabrication of a memory array of such cells, the cells are normally formed on top of a silicon substrate which has first been supplied with the conductive leads. The problem encountered is that such amorphous semiconductor materials interdiffuse with the metal and thus degrade device performance. Therefore, it is necessary to place a refractory metal between the amorphous cell and the underlying as well as the overlaying aluminum connectors. It has been discovered that refractory metals such as tantalum are particularly applicable for such a purpose. With the use of such a refractory metal on top of the aluminum connector, it is not necessary to provide the hard anodization barrier layer as the tantalum serves to suppress hillock formation whenever the wafer and corresponding circuitry is subjected to high temperatures or the aluminum metal is subjected to high current densities. Other refractory metals and alloys which form electrically isolating oxides are hafnium and nobium.

The employment of these particularly refractory metals and alloys serve to eliminate two anodization steps in the formation of a metal interconnect structure on an integrated circuit chip thereby reducing the time and the cost of manufacturing such circuits.

Figure 2:
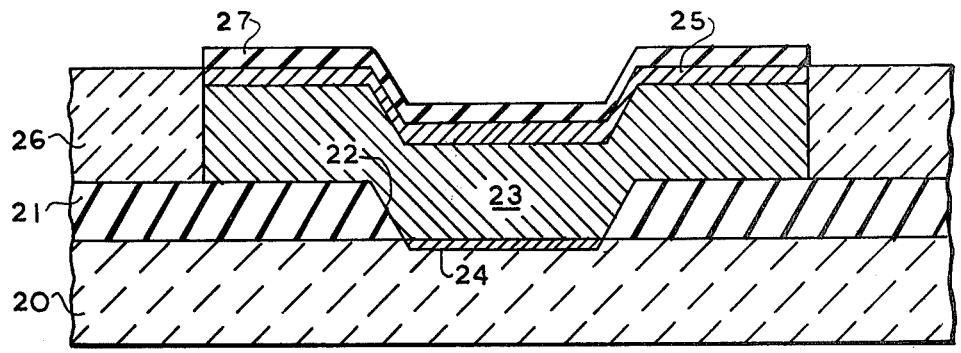

Another example of the prior art which is designed to overcome the above-described problems is illustrated in FIG. 2 and disclosed in the Holmberg U.S. Patent Application Ser. No. 919,277, filed June 26, 1978. After silicon dioxide layer 21 has been deposited on silicon substrate 20, via 22 is opened and aluminum layer 23 is deposited to form an aluminum-silicon alloy layer 24 with the silicon substrate. Aluminum layer 23 is approximately 1 micrometer thick. Tantalum layer 25 is then deposited over the aluminum to a thickness of approximately 1000 angstroms. Silicon dioxide layer 27 is then deposited over tantalum layer 25. A photoresist pattern is then formed over the silicon dioxide wherever the metal conductors are desired and the wafers then subjected to a carbon tetrafluoride plasma with approximately 4 percent oxygen to remove the silicon dioxide and tantalum from areas wherever soft anodization is to be carried out, thereby exposing portions of aluminum layer 23. The exposed aluminum surface is then anodized in a phosphoric, sulfuric solution to convert that exposed aluminum to aluminum oxide layer 26 down to the surface of silicon dioxide layer 21. The photoresist material is then removed and the wafer is then ready for the deposition of a second dielectric layer to receive another conductor and so forth.

The present invention provides a solution to the photoresist adhesion problem. It also provides a refractory barrier metal as would be required for amorphous memory devices. However, the present invention eliminates a photoresist step by utilizing the anodization of tantalum during the soft anodization step to form the appropriate mask during that step.

Figure 3:
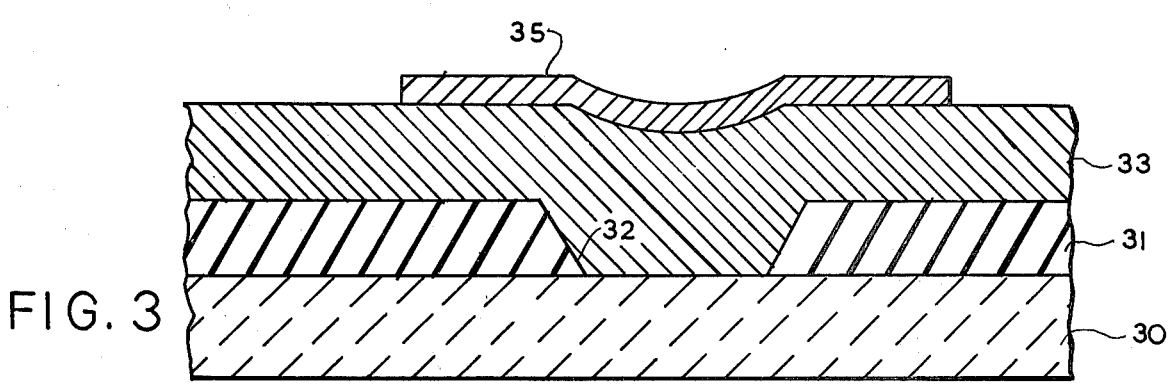
FIGS. 3–5 are cross-sectional views illustrating the method of the present invention.

As illustrated in FIG. 3, via 32 is opened in silicon dioxide layer 31 on the surface of substrate 30. Aluminum interconnect layer 33 is then deposited over insulative layer 31 and via 32. Although not shown, an aluminum silicon alloyed Schottky diode with silicon substrate 30 will be formed as described above. Tantalum layer 35 is then deposited over the aluminum in those areas where the interconnects are to be formed, the thickness of the tantalum layer being 0.1-0.15 micrometer. The aluminum layer is approximately 1 micrometer in thickness. Tantalum layer 35 is then patterned with a negative photoresist and etched in a carbon tetrafluoride plasma to form the structure of FIG. 3 where the remaining portions of tantalum layer 35 now define the aluminum interconnects structure finally to be achieved. The resist is then removed.

Figure 4:
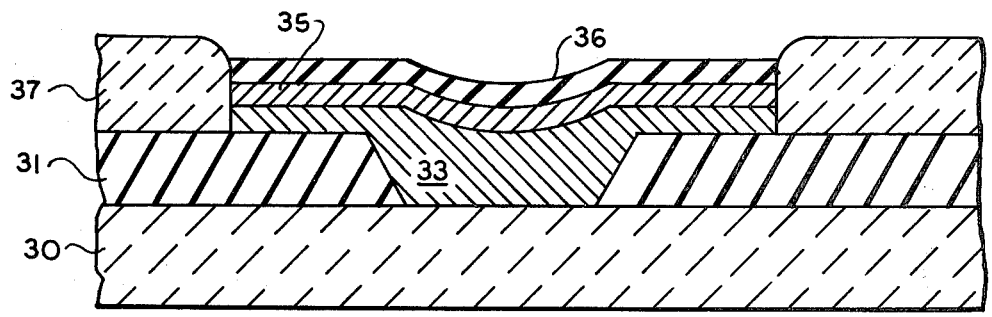

Refering now to FIG. 4, the bare tantalum layer 35 and aluminum layer 33 are anodized simultaneously in a phosphoric or oxalic electrolyte. Under these circumstances the tatalum will only form a barrier type anodic film 36 the thickness of which is dependent upon the anodizing voltage at a rate of about 14-16 angstroms per volt. The aluminum layer is anodized thereby to form porous anodic film 37 down to the dielectric layer 31 thereby defining the aluminum interconnect structure.

Figure 5:
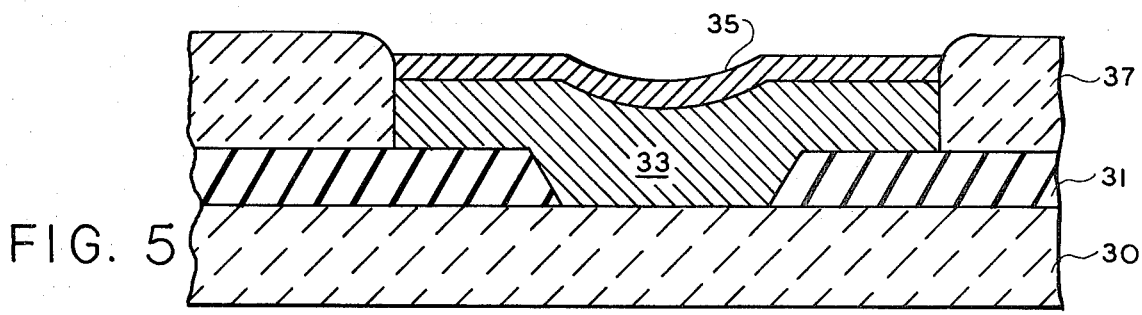

The tantalum oxide is easily etched by a carbon tetrafluoride plasma and can be removed from the tantalum surface leaving behind the unanodized tantalum layer 35 as illustrated in FIG. 5. This etch can be done after the anodization step or after the subsequent silicon dioxide dielectric has been deposited and vias etched therein down to the tantalum oxide.

Interconnect structures which do not require a barrier refractory metal may still benefit from the above described process because of the ease of manufacture and also because of the fact that tantalum is a hillock suppressant. Other metals which may be used include niobium and hafnium. However, these metals form a thicker barrier oxide layer per volt and, therefore, such metals must be deposited to a much thicker dimension than was described above in regard to tantalum.

EPILOGUE

A method has been disclosed for forming an aluminum interconnect structure on an integrated circuit chip which method employs the anodization of the aluminum but eliminates the necessity for the formation of a hard anodic barrier on the aluminum. Furthermore, the technique provides a superior "cold via" contact, including electrical contact with amorphous semiconductor material.

Although only one embodiment of the present invention has been disclosed, and it will be apparent to those skilled in the art that variations and modifications may be made therein without departing from the spirit and scope of the invention as claimed.

What is claimed is:

1. A method of forming an interconnect structure on a semiconductor substrate, said method comprising:
    depositing an aluminum layer on said substrate;
    depositing a layer of a refractory metal on said aluminum layer, said refractory metal being selected from the group of tantalum, hafnium and niobium;
    defining the interconnect structure on said refractory metal with a photoresist pattern;
    etching the exposed refractory metal to expose portions of said aluminum layer;
    removing said photoresist pattern;
    anodizing said exposed aluminum and said exposed refractory metal such that said exposed aluminum layer is completely anodized while only a thin layer of said refractory metal is anodized; and
    removing the thin layer of anodized refractory metal.
2. The method according to claim 1 wherein:
    said refractory metal is tantalum.
3. The method according to claim 1 wherein:
    said refractory metal is hafnium.
4. The method according to claim 1 wherein:
    said refractory metal is niobium.

5. The method according to claim 1 wherein:
the anodization is performed in a solution selected from phosphoric acid and oxalic acid.

6. The method according to claim 1 wherein:
said thin layer of anodized refractory metal is removed by a carbon tetriflouride plasma.

7. A method of forming an interconnect structure on a semiconductor substrate, said method comprising:
depositing a dielectric layer on said substrate and opening vias therein; p1 depositing an aluminum layer on said dielectric layer and said vias;
depositing a layer of a refractory metal on said aluminum layer, said refractory metal being selected from the group of tantalum, hafnium and niobium;
defining the interconnect structure on said refractory metal with a photoresist pattern;
etching the exposed refractory metal to expose portions of said aluminum layer;
removing said photoresist pattern;
anodizing said exposed aluminum and said exposed refractory metal such that said exposed aluminum layer is completely anodized while only a thin layer of said refractory metal is anodized; and
removing the thin layer of anodized refractory metal.

8. The method according to claim 7 wherein:
said refractory metal is tantalum.

9. The method according to claim 7 wherein:
said refractory metal is hafnium.

10. The method according to claim 7 wherein:
said refractory metal is niobium.

* * * * *